United States Patent
Hentschel et al.

(10) Patent No.: US 8,432,694 B2
(45) Date of Patent: Apr. 30, 2013

(54) POWER CONVERTER MODULE WITH COOLED BUSBAR ARRANGEMENT

(75) Inventors: Stefan Hentschel, Weisendorf (DE); Harald Ponath, Hirschaid (DE)

(73) Assignee: Siemens Aktiengesellschaft, München (DE)

( * ) Notice: Subject to any disclaimer, the term of this patent is extended or adjusted under 35 U.S.C. 154(b) by 146 days.

(21) Appl. No.: 13/133,798

(22) PCT Filed: Sep. 29, 2009

(86) PCT No.: PCT/EP2009/062579
§ 371 (c)(1),
(2), (4) Date: Jun. 9, 2011

(87) PCT Pub. No.: WO2010/066483
PCT Pub. Date: Jun. 17, 2010

(65) Prior Publication Data
US 2011/0249402 A1 Oct. 13, 2011

(30) Foreign Application Priority Data
Dec. 10, 2008 (DE) .......... 10 2008 061 468

(51) Int. Cl.
*H05K 7/20* (2006.01)

(52) U.S. Cl.
USPC .......... 361/699; 165/80.4

(58) Field of Classification Search .......... 361/699
See application file for complete search history.

(56) References Cited

U.S. PATENT DOCUMENTS

| | | | |
|---|---|---|---|
| 4,381,032 A | 4/1983 | Cutchaw | |
| 5,694,301 A * | 12/1997 | Donegan et al. | 361/830 |
| 5,804,761 A * | 9/1998 | Donegan et al. | 174/15.1 |
| 5,923,085 A | 7/1999 | Colello | |
| 5,992,922 A | 11/1999 | Harbig et al. | |
| 6,456,516 B1 * | 9/2002 | Bruckmann et al. | 363/144 |
| 6,574,094 B1 * | 6/2003 | Morrow et al. | 361/676 |
| 6,885,553 B2 * | 4/2005 | Pfeifer et al. | 361/688 |
| 7,952,875 B2 * | 5/2011 | Woody et al. | 361/699 |
| 8,007,255 B2 * | 8/2011 | Hattori et al. | 417/410.1 |
| 2007/0114665 A1 | 5/2007 | Bayerer | |
| 2008/0130223 A1 * | 6/2008 | Nakamura et al. | 361/689 |
| 2009/0040724 A1 * | 2/2009 | Nishikimi et al. | 361/699 |
| 2010/0302733 A1 * | 12/2010 | Woody et al. | 361/699 |

FOREIGN PATENT DOCUMENTS

| DE | 298 13 254 U1 | 10/1998 |
| DE | 11 2006 00 2302 T5 | 7/2008 |
| DE | 10 2007 003 875 A1 | 8/2008 |
| JP | 2151056 A | 6/1990 |

(Continued)

*Primary Examiner* — Gregory Thompson
(74) *Attorney, Agent, or Firm* — Henry M. Feiereisen LLC

(57) ABSTRACT

A power converter module includes at least two power semiconductor modules, which are mechanically connected to a liquid-cooled heat sink and electrically connected to terminals of the power converter module by a busbar arrangement having at least two busbars. The busbars are insulated from one another by an insulation layer. The insulation layer is composed of two insulating layers, which are materially connected with one another so as to form therebetween a cavity having a predetermined shape and an entrance side and an exit side disposed on least one side face of the insulation layer. A connector is provided on the entrance side and the exit side and fluidly connected to the liquid-cooled heat sink. The rectifier module is thus able to sustain relatively high electrical loads compared to conventional rectifier modules, while maintaining a permitted temperature for the insulation layer and the lamination material of the busbar.

16 Claims, 2 Drawing Sheets

FOREIGN PATENT DOCUMENTS

| | | |
|---|---|---|
| JP | 53 25644 A | 12/1993 |
| JP | 2002 252327 A | 9/2002 |
| WO | WO 2004 079792 A2 | 9/2004 |
| WO | WO 2005 109505 A1 | 11/2005 |

\* cited by examiner

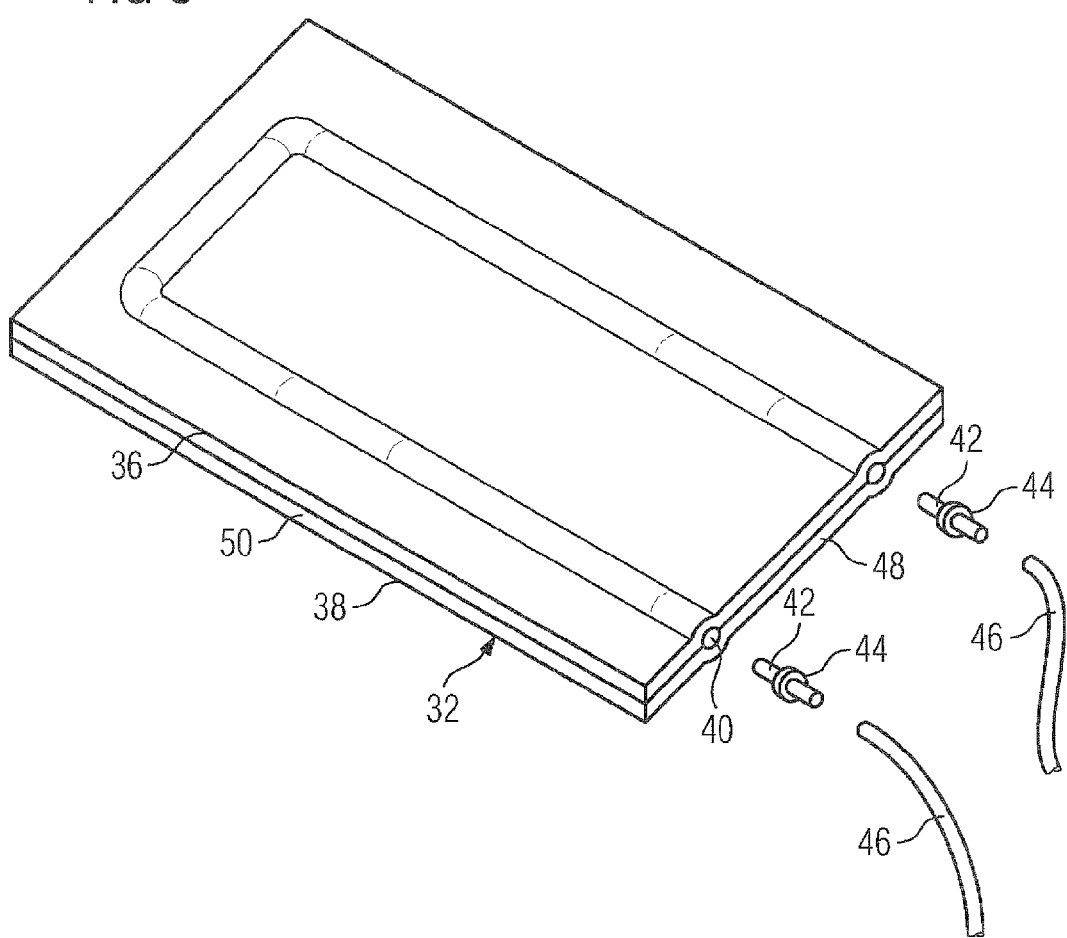

US 8,432,694 B2

POWER CONVERTER MODULE WITH COOLED BUSBAR ARRANGEMENT

CROSS-REFERENCES TO RELATED APPLICATIONS

This application is the U.S. National Stage of International Application No. PCT/EP2009/062579, filed Sep. 29, 2009, which designated the United States and has been published as International Publication No. WO 2010/066483 and which claims the priority of German Patent Application, Serial No. 10 2008 061 468.8, filed Dec. 10, 2008, pursuant to 35 U.S.C. 119(a)-(d).

BACKGROUND OF THE INVENTION

The invention relates to a power converter module with a cooled busbar arrangement.

Power converter modules of the generic type, in particular for relatively high powers, are commercially available. In the case of such power converter modules, their power semiconductor modules, in particular turn-off power semiconductor modules, are connected to connections of the power converter module by a low-inductance busbar arrangement. This is achieved by virtue of the fact that the busbars used are embodied in planar fashion and stacked one above another to form a busbar stack. An insulating layer embodied in planar fashion is arranged in each case between two planar busbars. These insulating layers project beyond the planar busbars in order that limit values for air clearances and creepage paths can be complied with. Consequently, such a low-inductance busbar arrangement has at least two busbars and at least one insulating layer. In order that the busbar arrangement of the employed power semiconductor modules of the power converter module is configured as compactly as possible, this busbar assembly is laminated. By virtue of the materials used, in particular the lamination material, and the plastic used, this busbar arrangement has a temperature limit of 105° C., for example.

Since, in the commercially available power semiconductor modules, in particular turn-off power semiconductor modules, for example Insulated Gate Bipolar Transistor (IGBT), the current-carrying capacity continuously increases, the current density correspondingly increases in the busbars of a busbar arrangement, in particular of a laminated busbar arrangement, of a power converter module. This results in a quadratic increase in the losses in the busbar arrangement, such that the temperature of this busbar arrangement likewise increases and cannot be lowered by means of the baseplate of a semiconductor module or the cooling body thereof. The limit temperature of a busbar arrangement is determined by the employed materials of the insulating layers, of the lamination material and of the adhesive. Preferably, at the present time, use is made of busbar arrangements that are laminated in power converter modules with an insulating film. In this case, the lamination material of the laminated busbar arrangement sets a temperature limit. For power converter applications, this means a power limitation which is no longer governed by the power semiconductor modules used, but rather by the maximum limit temperature of the corresponding lamination material of the busbar arrangement.

Obvious solutions to this problem include, firstly, increasing the cross section of each busbar of the busbar arrangement, and, secondly, cooling this busbar arrangement, for example by inherent convection. By increasing the cross sections of the busbars of the busbar arrangement, such a busbar arrangement not only is more costly, but also has a higher weight. In order to cool the busbar arrangement by inherent convection, it has to be arranged in a power converter apparatus in such a way that a cooling air stream can flow over this busbar arrangement.

WO 2005/109505 A1 discloses a power semiconductor circuit whose busbar arrangement is cooled. In the case of this power semiconductor circuit, at least one module is soldered on the outer side on a plate-type busbar serving as positive or negative plate. The positive and negative busbars are usually arranged as topmost and bottommost plates, respectively, on a plate busbar assembly. This top busbar, on which the module is applied, is cooled directly by a cooling device, wherein this cooling device is embodied as air or liquid cooling. This cooling device is arranged in a sandwich-like manner between the top busbar and, with the interposition of an insulation, a further plate-type busbar lying in a parallel plane. Furthermore, a busbar on the underside is provided with the interposition of a further insulating layer. These busbars form together with the cooling device a very compact arrangement. The elements of this busbar assembly are connected to one another by lamination. Since this power semiconductor circuit is an inverter, two intermediate circuit capacitors are arranged below this busbar assembly, these capacitors being connected to the upper and lower busbars, respectively, by means of screw connections.

DE 10 2007 003 875 A1 discloses a power converter module comprising at least two power semiconductor modules which are mechanically connected to a cooling body in a thermally conductive manner and are electrically interconnected by means of a laminated busbar arrangement. At least one busbar of this laminated busbar arrangement is thermally linked to the cooling body by means of at least one electrically insulating and thermally conductive supporting element. By means of these supporting elements, at least one busbar of the laminated busbar arrangement is thermally linked to the cooling body. The magnitude of the heat to be dissipated determines the number of thermally conductive supporting elements. By means of these supporting elements, the laminated busbar arrangement is likewise supported in the edge regions. The quantity of heat to be dissipated from the laminated busbar arrangement is restricted by means of these thermally conductive supporting elements.

The invention is based on the object, then, of specifying a power converter module, from the busbar arrangement of which heat can be dissipated using simple means, wherein this power converter module does not have to be rerouted or redesigned.

SUMMARY OF THE INVENTION

This object is achieved according to the invention by a power converter module having at least two power semiconductor modules, which are mechanically connected to a liquid-cooled heat sink for thermal conduction and are electrically connected to terminals of the power converter module by a busbar arrangement having at least two busbars. The busbars are insulated from one another by an insulation layer, wherein the insulation layer is composed of two insulating layers, which are materially connected with one another so as to produce between the two insulating layers a cavity having a predetermined shape and an entrance side and an exit side disposed on least one side face of the insulation layer. A connector is provided on the entrance side and the exit side and connected to the liquid-cooled heat sink for fluid conduction.

By virtue of the fact that, as insulation of two busbars of a busbar arrangement of a power converter module, two insulating layers are provided, which are connected to one another cohesively in such a way that a cavity arises between these two insulating layers, this cavity opening on the entrance and exit side in at least one side surface of this insulation layer, the two busbars bearing against this insulation layer can be cooled. By means of two connectors and two hoses, this insulation layer can be fluidly connected to a cooling circuit of the liquid-cooled heat sink of the power converter module. As a result of the cooling of the insulation layer of two busbars of a busbar arrangement, the layer temperature is raised, such that now the power capacity of the power converter module is again determined by a power capacity of the power semiconductor modules used.

In one advantageous embodiment of the power converter module, at least one insulating layer of the insulation layer of the busbar arrangement is embodied as a shaped part having a groove shaped in a predetermined manner. Through the use of at least one insulating layer embodied as a shaped part, the production of an insulation layer with cavity is significantly simpler.

If both insulating layers of the insulation layer of the busbar arrangement are each embodied as a shaped part, then these two insulating layers are embodied mirror-symmetrically with respect to one another. Once these two insulating layers are connected to one another cohesively, an insulation layer with a cavity is obtained with which a busbar arrangement can be liquid-cooled.

In one advantageous embodiment of the power converter module, the busbars and at least one insulation layer of the busbar arrangement of the power converter module are laminated with one another. As a result, this busbar arrangement forms a mechanical unit and can be handled like a commercially available laminated busbar arrangement.

In a further advantageous embodiment of the power converter module, the cavity is embodied in a hose-like manner and runs in a meandering manner between the two insulating layers. As a result, this cavity between the two insulating layers corresponds functionally to a house through which a coolant, in particular tap water, can be passed. By virtue of this cavity being disposed in a meandering manner between the two insulating layers, heat can be dissipated from approximately the entire area of this insulation layer.

In a further advantageous embodiment of the power converter module, the hose-like cavity between the two insulating layers is fluidly connected in parallel with the cooling circuit of the liquid-cooled heat sink. For this purpose, the cavity has on the entrance and exit side in each case a connector whose end is provided with a hose. By virtue of the supply of the insulation layer of the busbar arrangement of the power converter module from a liquid-cooled heat sink, the connections, in particular the coolant connections, of the power converter module remain unchanged.

In a further advantageous embodiment of the power converter module, the cavity has different cross sections in sections. Through the variation of the cavity cross section in terms of the form and size of the cross-sectional area, it is possible to influence the flow rate of the cooling liquid for specific regions of at least one busbar in a predetermined manner.

BRIEF DESCRIPTION OF THE DRAWING

For further elucidation of the invention, reference is made to the drawing which schematically illustrates an embodiment.

FIG. 3 illustrates an insulation according to the invention of a busbar arrangement according to FIG. 2.

DETAILED DESCRIPTION OF PREFERRED EMBODIMENTS

Figure 1:
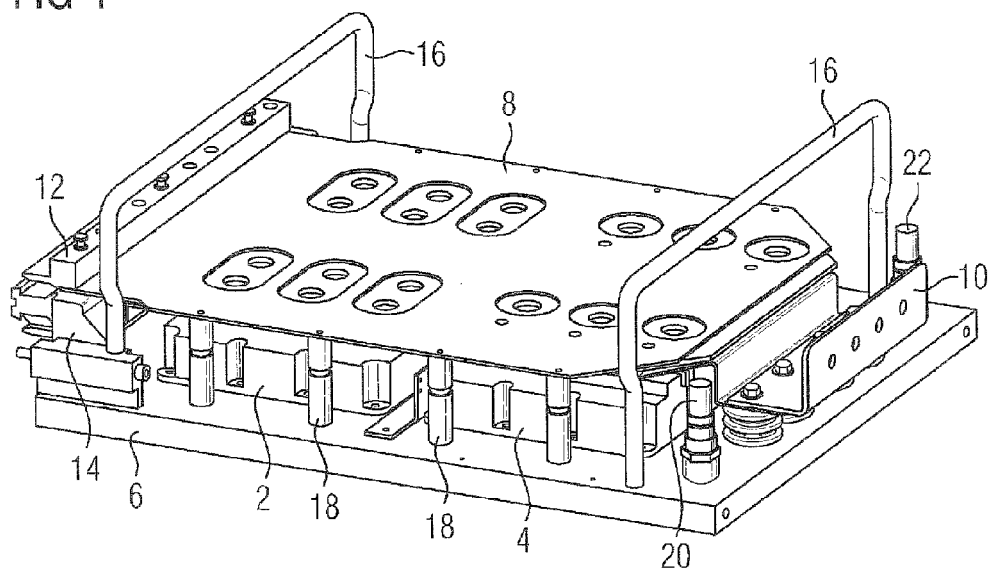
FIG. 1 shows a commercially available power converter module.

In FIG. 1, which illustrates a perspective view of a commercially available power semiconductor module, 2 and 4 in each case designate a power semiconductor module, in particular a turned-off power semiconductor module, for example an insulated gate bipolar transistor (IGBT), 6 designates a liquid-cooled heat sink, 8 designates a busbar arrangement, 10 designates an AC voltage connection, 12 and 14 in each case designate a DC voltage connection, 16 designates a clip, and 18 designates supporting elements. In addition, a coolant inlet and outlet are designated by 20 and 22 in this illustration.

The two power semiconductor modules 2 and 4 are mechanically fixed to the liquid-cooled heat sink 6 in a releasable manner. The busbar arrangement 8 can have two busbars, for example one positive busbar and one load busbar or one load busbar and one negative busbar, or three busbars, for example one positive, load and negative busbar. The number of busbars of the busbar arrangement 8 is dependent on the electrical interconnection of the two power semiconductor modules 2 and 4. If these two power semiconductor modules 2 and 4 are electrically connected in parallel, then the busbar arrangement 8 only has two busbars. By contrast, if these two power semiconductor modules 2 and 4 are electrically connected in series and form a phase module of a power converter, then the busbar arrangement 8 has three busbars. If the power converter module is used as a phase module, then the three busbars of the busbar arrangement 8 are one positive, load and negative busbar. These busbars are arranged one above another, wherein an insulating layer is arranged in each case between two busbars, and laminated.

This busbar arrangement 8 is arranged onto the electrical connections of each power semiconductor module 2 and 4. These electrical connections can be soldering pins, cage nuts or threaded bolts. Starting from a predetermined power capacity of the power semiconductor module 2, 4, the power semiconductor modules 2, 4 have as electrical connections only cage nuts for fixing threaded bolts. In accordance with the interconnection of the two power semiconductor modules 2, 4, the connections thereof are in each case electrically conductively connected to a predetermined busbar of the busbar arrangement 8. This busbar arrangement 8 is supported not only on the connections of the power semiconductor modules 2, 4, but also on a plurality of supporting elements 18. The latter are arranged along a respective longitudinal side of the power converter module. At the end sides of the busbar arrangement, this busbar arrangement is held together with the connections 12, 14 and 10.

Since a liquid-cooled heat sink 6 is provided as the cooling body of this power converter module, this liquid-cooled heat sink has a coolant inlet 20 and a coolant outlet 22. With this coolant inlet and outlet 20 and 22, the power converter module is fluidly connected to a coolant circuit. Any liquid, in particular tap water, can be used as the cooling liquid.

Since the current-carrying capacity of the power semiconductor modules 2, 4 used in the power converter module continuously increases, the current in the busbars of the busbar arrangement 8, in particular of a laminated busbar arrangement 8, also rises. This results in a quadratic increase in the losses in the busbar arrangement 8. As a result, the temperature in the busbar arrangement 8 rises. The possible magnitude of the limit temperature of the busbar arrangement 8 is dependent on the materials used. That is to say that the insulating material, in particular the lamination material, of the busbar arrangement 8 fixes the temperature limit. That means for power converter applications a power limitation which is no longer determined by the power semiconductor modules 2, 4 used, but rather by the material-specific limit temperature of an insulating or lamination material.

Figure 2:
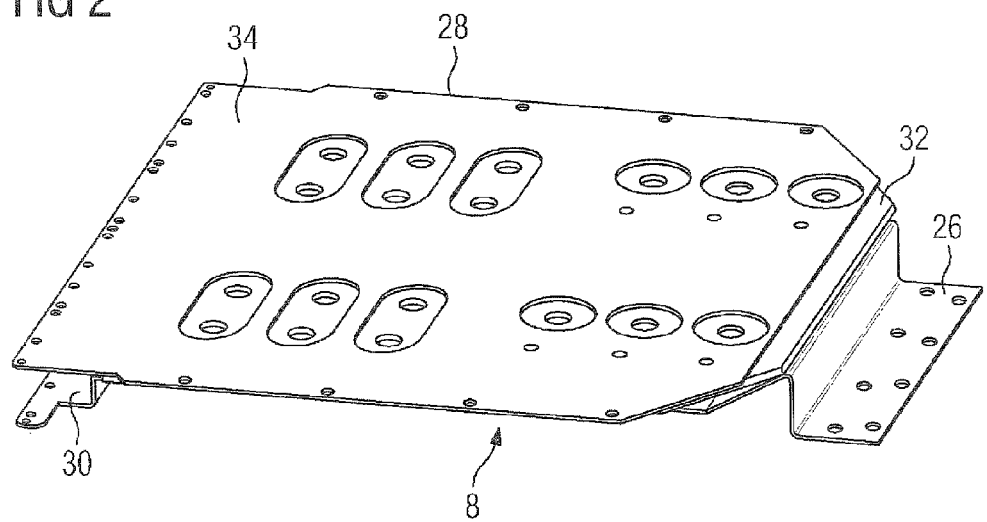
FIG. 2 illustrates a busbar arrangement of a power converter module according FIG. 1.

For the sake of clarity, FIG. 2 perspectively illustrates only the busbar arrangement 8 of the power converter module according to FIG. 1, the elements of the busbar arrangement 8 not yet being laminated with one another. As already mentioned, a power converter module as phase module of a polyphase power converter has two power semiconductor modules 2 and 4, which are electrically connected in series. The junction point of this series connection of two power semiconductor modules 2 and 4 forms an AC voltage connection 10, in particular a load connection. A busbar 26, also designated as load busbar, of the busbar arrangement 8 is electrically conductively connected to this load connection 10. The DC voltage connections 12 and 14 of the power converter module are in each case electrically conductively connected to a busbar 28 and 30, respectively, which are also designated as positive and negative busbar, respectively. These busbars 26, 28 and 30 are arranged spatially one above another, wherein an insulation layer 32 is in each case arranged between two adjacent busbars 26, 28 and 28, 30. Consequently, a commercially available busbar arrangement of a phase module has at least five layers. In order that these layers are mechanically fixed in relation to one another, this stack of three busbars 26, 28 and 30 and at least two insulation layers 32 is laminated with one another. In addition, the required air clearances and creepage paths are complied with as a result.

In the perspective illustration in accordance with FIG. 2, the busbar arrangement 8 has only three layers, namely a lower layer, in which the negative and load busbars 30 and 26 are arranged alongside one another, an insulating layer, in which the insulating layer 32 is arranged, and an upper layer, in which the positive busbar 28 is arranged. No additional insulating layer is arranged on the surface 34 of the upper and lower busbars 28 and 30, respectively, of the busbar arrangement 8. The insulation of these surfaces 34 is performed by the laminate.

In order to be able to dissipate the power loss produced in the laminated busbar arrangement 8, the insulation layer 32 of the busbar arrangement 8 is provided with a cavity 40 (FIG. 3). This cavity 40 is connected in terms of coolant to the liquid circuit of the liquid-cooled heat sink 6. The liquid circuit of the liquid-cooled heat sink 6 is designated as the primary circuit, and the liquid circuit of the cavity 40 is designated as the secondary circuit. The primary and secondary circuits, can be connected for fluid conduction in parallel or in series.

According to the invention, at least one insulation layer 32 of the busbar arrangement 8 of the power converter module is provided with a cavity 40. An insulation layer 32 according to the invention is illustrated perspectively in FIG. 3. This insulation layer 32 has two insulating layers 36 and 38, which are connected to one another cohesively. In this case, these two insulating layers 36 and 38 are connected to one another cohesively in such a way that a cavity 40 arises. In order that this cavity 40 has a desired cross-sectional area, compressed air is introduced in this cavity 40. As a result, this cavity 40 is inflated. In order that the cross-sectional area of the cavity 40 is approximately constant over the entire length of this cavity, these two insulating layers 36 and 38 connected to one another cohesively are inserted in a mold. An advantageous cross-sectional area of the cavity 40 is rectangular since, as a result, two busbars 28, 30 arranged on both sides are not spaced apart significantly further from one another.

In order to obtain such a cavity 40, at least one of the two insulating layers 36 or 38 can be embodied as a shaped part having a groove shaped in a predetermined manner. The groove can be V-shaped in cross-section. If both insulating layers 36 and 38 are embodied as a shaped part, then these are constructed mirror-symmetrically with respect to one another. These two shaped parts are likewise connected to one another cohesively. In the exemplary embodiment illustrated (FIG. 3), each groove of an insulating layer 36 and 38 embodied as a shaped part is semicircular. Since these two insulating layers 36 and 38 embodied as a shaped part are constructed mirror-symmetrically, an insulation layer 32 with the cavity 40 illustrated arises as a result of a cohesive connection of these two insulating layers 36 and 38.

In order that this cavity 40 can guide cooling liquid through this insulation layer 32, it has to be fluidly connected to a cooling circuit. For this purpose, two connectors 42 and two hoses 46 are provided. Each connector 42 has a ring-shaped flange 44 centrally. Each end of the connector 42 runs in a tapering manner from this ring-shaped flange 44. As a result, firstly, this connector 42 can be plugged into an opening of the cavity 40 without great effort and, secondly, the hose 46 can be plugged onto the still free end of the connector 42 without great effort. In the mounted state of the connector 42, the ring-shaped flange 44 is supported on a side surface of the insulation layer 32. In the example illustrated, the ring-shaped flange 44 of each connector 42 is supported on the end surface 48 of the insulation layer 32. In the illustration of the insulation layer 32 in accordance with FIG. 3, the cavity 40 produced runs in a U-shaped manner in the insulation layer 32. That is to say that both ends of this cavity 40 open in the end surface 48 of the insulation layer 32. In order to dissipate heat from the insulation layer 32 over a large area, the cavity 40 produced has to run in a meandering manner between the two ends in the end side 48 of the insulation layer 32. It is also possible for the two ends of the cavity 40 to open in opposite end surfaces 48 of the insulation layer 32. It is also conceivable for the two ends of the cavity 40 to open in each case in a narrow surface 50 or in a narrow surface 50 and an end surface 48. The cooling circuit defined by the cavity 40 is designated as the secondary circuit. By contrast, the cooling circuit of the liquid-cooled heat sink 6 is designated as the primary circuit. These two cooling circuits can now be connected for fluid conduction in parallel or in series. The parallel connection of the secondary circuit to the primary circuit is advantageous since both circuits are then supplied with coolant that has not initially been subjected to any stress.

By means of this insulation layer 32 embodied according to the invention, which insulation layer together with busbars 26, 28 and 30 are stacked and laminated to form a busbar arrangement 8, heat can be dissipated from the busbar arrangement 8 in such a way that the power of the power converter module is once again determined by the power capacity of the power semiconductor modules 2 and 4 used, and is no longer determined by a limit temperature of the lamination material used. Consequently, the electrical capacity utilization of the power converter module according to the invention can be higher than that of a commercially available power converter module, and in this case the permissible temperature for the insulation layer 32 and the lamination material can be complied with.

What is claimed is:

1. A power converter module, comprising:
a liquid-cooled body;
a busbar arrangement having at least two busbars;
an insulation layer comprising two insulating layers which are materially connected with one another so as to produce between the two insulating layers a cavity of a predetermined shape, said insulation layer providing insulation between the at least two busbars;
an entrance side and an exit side disposed on least one side face of the insulation layer;
a connector arranged on the entrance side and the exit side and fluidly connected to the liquid-cooled body; and
at least two power semiconductor modules, which are mechanically connected to the liquid-cooled body for thermal conduction and are electrically connected to terminals of the power converter module by the busbar arrangement.

2. The power converter module of claim 1, wherein at least one of the two insulating layers is embodied as a shaped part comprising a groove shaped in a predetermined manner.

3. The power converter module of claim 1, wherein the two insulating layers are constructed mirror-symmetrically.

4. The power converter module of claim 1, wherein the at least two busbars and at least one of the two insulation layers are laminated with one another.

5. The power converter module of claim 1, wherein the cavity has a hose-like shape.

6. The power converter module of claim 1, wherein the cavity has a meander shape.

7. The power converter module of claim 1, wherein the connector comprises a ring-shaped flange.

8. The power converter module of claim 7, wherein the ring-shaped flange is arranged between two ends of the connector and the connector is tapered toward the respective ends.

9. The power converter module of claim 1, wherein the cavity is connected for fluid conduction in parallel with a cooling circuit of the liquid-cooled body.

10. The power converter module of claim 1, wherein the cavity is connected for fluid conduction in series with a cooling circuit of the liquid-cooled body.

11. The power converter module of claim 1, wherein the cavity has a circular cross-sectional area.

12. The power converter module of claim 1, wherein the cavity has a rectangular cross-sectional area.

13. The power converter module of claim 2, wherein the groove has a V-shape in cross-section.

14. The power converter module of claim 2, wherein the groove has a semicircular shape in cross-section.

15. The power converter module of claim 2, wherein the groove has a U-shape in cross-section.

16. The power converter module of claim 2, wherein the cavity is constructed in sections, with different sections having different cross-sectional areas.

* * * * *